(12) United States Patent
Chan et al.

(10) Patent No.: US 6,495,200 B1
(45) Date of Patent: Dec. 17, 2002

(54) METHOD TO DEPOSIT A SEEDING LAYER FOR ELECTROLESS COPPER PLATING

(75) Inventors: Lap Chan, San Francisco, CA (US); Fong Yau Li, Singapore (SG); Hou Tee Ng, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 252 days.

(21) Appl. No.: 09/206,733

(22) Filed: Dec. 7, 1998

(51) Int. Cl.[7] .......................... B05D 5/12; H01L 21/4763
(52) U.S. Cl. ........................... 427/97; 427/98; 427/125; 438/626; 438/627; 438/643; 438/645; 438/653; 438/672; 438/675; 438/686; 438/687
(58) Field of Search ................................. 438/625–626, 438/643–645, 672–677, 652–654, 686–687; 427/97, 98, 125, 383.1, 405

(56) References Cited

U.S. PATENT DOCUMENTS

| | | | |
|---|---|---|---|
| 4,282,271 A | | 8/1981 | Feldstein ..................... 427/98 |
| 4,574,095 A | | 3/1986 | Baum et al. ................ 427/53.1 |
| 5,153,023 A | * | 10/1992 | Orlowski et al. ........... 427/555 |
| 5,198,389 A | * | 3/1993 | Van Der Putten et al. .. 437/190 |
| 5,656,542 A | * | 8/1997 | Miyata et al. ............... 438/645 |
| 5,674,787 A | | 10/1997 | Zhao et al. .................. 437/230 |
| 5,834,366 A | * | 11/1998 | Akram ........................ 438/614 |
| 5,891,804 A | * | 4/1999 | Havermann et al. ........ 438/674 |
| 5,895,261 A | * | 4/1999 | Schinella et al. ........... 438/677 |

\* cited by examiner

*Primary Examiner*—Brian K. Talbot
(74) *Attorney, Agent, or Firm*—George O. Saile; Rosemary L. S. Pike; William J. Stoffel

(57) ABSTRACT

A method of for electroless copper deposition using a Pd/Pd acetate seeding layer formed in using only two components (Pd acetate and solvent) to form an interconnect for a semiconductor device. The invention has two preferred embodiments. The first embodiment forms a Key seed layer composed of Pd/Pd acetate by a spin-on or dip process for the electroless plating of a Cu plug. The second embodiment forms a Pd passivation cap layer over the Cu plug to prevent the Cu plug from oxidizing.

16 Claims, 2 Drawing Sheets

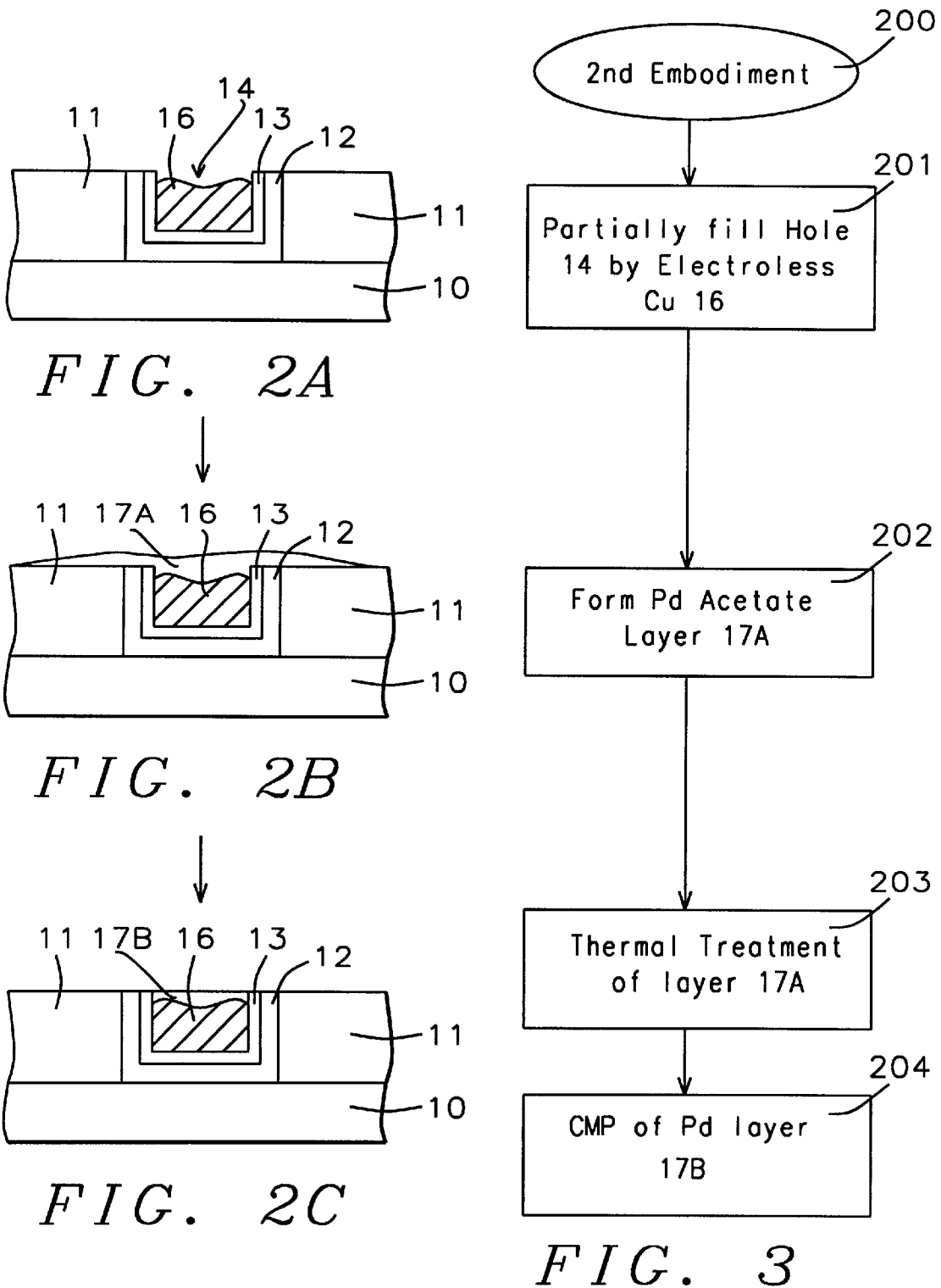

METHOD TO DEPOSIT A SEEDING LAYER FOR ELECTROLESS COPPER PLATING

BACKGROUND OF THE INVENTION

1. Field of the Invention

This invention relates generally to the electroless depositing of Copper plating for semiconductor devices and particularly to a method for forming a seeding layer for Cu electroless plating for a semiconductor device and more particularly to a method for forming a Pd/Pd acetate seeding layer for a Cu plug for a interconnect.

2. Description of the Prior Art

With continual decrease in semiconductor device dimensions and rapid increase in packing density, parallel development of multilayer interconnect technology cannot be overemphasized. Related issues like RC delay, cross talk, etc. become more important as the dimensions constantly scaled down to the deep submicron regime. Thus, advanced metalization materials are required. Copper has been very much envisioned to be the next potential candidate and deposition by the electroless approach appears to be an attractive one based on factors like low cost of ownership, complete via interconnect fill, etc. In general a catalytic seeding layer like CVD Cu or Pd/Pt deposited on a diffusion barrier like TiN and TaN is required. However, such process are either too costly or contain counterions.

U.S. Pat. No. 5,674,787 (Zhao) Selective electroless copper deposited interconnect plugs for ULSI applications—shows a selective Cu electroless deposition in a via hole using a seed layer. A contact displacement technique is used to form a thin activation layer of copper on a barrier metal, such as TiN, which is present as a covering layer on the underlying metal layer. An electroless copper deposition technique is then used to auto-catalytically deposit copper in the via.

U.S. Pat. No. 4,574,095 (Baum): Selective deposition of copper—teaches a process for selectively depositing copper by first selectively depositing palladium seeds by irradiating a palladium compound with light. Following the deposition of the palladium seeds, copper is deposited by an electroless process.

U.S. Pat. No. 4,282,271 (Feldstein) shows another method of electroless depositing Cu.

However, an improved method of Cu electroless is needed.

SUMMARY OF THE INVENTION

It is an object of the present invention to provide a method for using a palladium (Pd) acetate seed layer (with optional thermal decomposition) for electroless copper plating.

It is an object of the present invention to provide a method for using a Pd acetate seed layer (with/with out optional thermal decomposition) for electroless copper plating to form interconnect structures in semiconductor chip.

It is an objective of the present invention to provide a method to thermally treat Pd acetate (e.g., Pd metal) to form a seeding layer.

It is yet another objective of the present invention to form a Pd passivation cap layer over a Cu plug to minimize the oxidation of the Cu plug.

To accomplish the above objectives, the present invention provides a method to deposit a seeding layer for electroless copper plating to form an interconnect or conductive line.

The invention has two preferred embodiments. The first embodiment forms an important seed layer 13 composed of Pd acetate by a spin-on or dip process for the electroless plating of a Cu fill 16. See FIGS. 1A–1D.

The second embodiment forms a Pd passivation layer cap 17B over the Cu fill 16 to prevent the Cu fill from oxidizing. See FIGS. 2A to 2C and FIG. 3.

The method for the first embodiment involves the following steps:

a) An insulating layer 11 having an opening 14 is formed over a substrate 10; the insulating layer 11 having a top surface 11A.

b) A diffusion barrier layer 12 is formed over the insulating layer 11.

c) In a key step, a seeding film 13 composed of a combination of Palladium (Pd) and palladium acetate is formed over the diffusing barrier layer 12. The seeding film 13 is formed by dip coating or spin-on.

d) In an optional thermal decomposition step, the seeding film 13 is thermally decomposed to change the Pd acetate into Palladium or a combination of Pd acetate and Pd.

e) Next, we chemical-mechanical polish and remove the seeding film 13 and the diffusing barrier layer 12 from over the top surface 11A of the insulating layer 11.

f) Now, we electrolessly plate Cu over the seeding film 13 forming a copper fill 16 (plug) filling the hole 14.

g) The copper fill 16 is chemical-mechanical polished to planarize the copper fill (copper plug) 16 to a level even with the top surface 11A of the insulating layer 11.

The second embodiment forms a Pd passivation cap 17B over the Cu fill 16 by a process involving the same steps as the first embodiment up to the electroless Plating of Cu. See FIGS. 2A–2C. The Second embodiment's Cu fill 16 only partially fills the hole 14. Next, a key passivation layer composed of a combination of Pd/Pd acetate is formed on the Cu plug and at least fills the hole. The passivation layer is formed by a process of dip coating or spin-on. The passivation layer is then chemical-mechanical polished.

The invention's first embodiment application of thermal/non-thermal treated Pd acetate film 13 as a catalytic/seeding layer for electroless copper plating has several advantages:

the kinetics/rate of plating is either comparable or faster than that of the conventional approaches.

In the seed bath, undesirable counter ions like Cl⁻ may be excluded with the present invention where by no such species is present.

The seeding bath comprises mainly two components: ① Pd acetate and ② a suitable solvent, unlike conventional seed baths whereby three or four toxic and corrosive components are required.

The present invention has lower cost of ownership.

The second embodiment of the present invention forms a Pd cap passivation layer 17B over the Cu fill 16. The Pd cap passivation layer 17B prevents the Cu fill 16 from oxidizing.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 2A, 2B, 2C show a second embodiment of the invention that forms a Palladium (Pd) passivation layer 17B over the Cu plug 16 to prevent the copper(Cu) plug 16 from oxidation.

FIG. 3 is a flow chart outlining the steps for the second embodiment of the present invention.

DETAILED DESCRIPTION OF THE PREFERRED EMBODIMENTS

The present invention will be described in detail with reference to the accompanying drawings. The present invention provides a method of forming a thermal or non-thermal treated Pd acetate film as a catalytic /seeding layer for electroless copper plating 16. The invention can be used to form metal patterns, metal lines, interconnects etc. using damascene, dual damascene or other processes and is not limited to the configuration shown in the figures.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

Substrate 10 is understood to possibly include a semiconductor wafer, active and passive devices formed within the wafer and layers formed on the wafer surface. The term "substrate" is meant to include devices formed within a semiconductor wafer and the layers overlying the wafer. The term "substrate surface" is meant to include the upper most exposed layers on a semiconductor wafer, such as a silicon surface, insulating layer and metallurgy lines.

1$^{st}$ Embodiment—Pd Acetate/Pd Seed Layer For Cu Electroless Plating

Figure 1A:
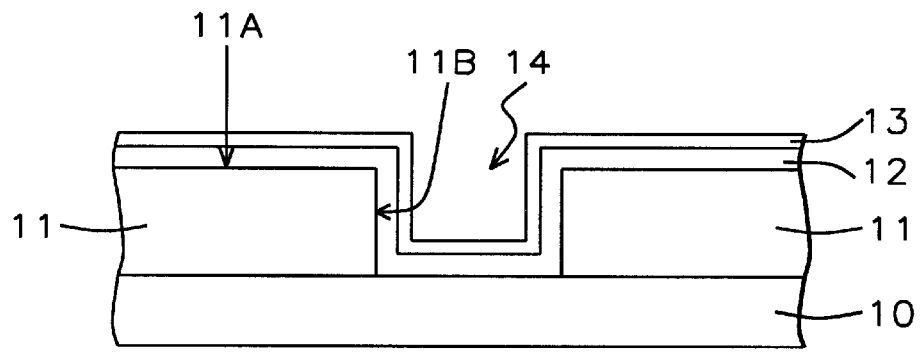
FIGS. 1A through 1D are cross sectional views for illustrating a first embodiment of a method for using a Pd acetate seeding layer for electroless depositing of a semiconductor filling according to the present invention.

As shown in FIG. 1A, an insulating layer 11 is formed having an opening 14 over a substrate 10. The substrate can represent a semiconductor substrate (e.g., Silicon) and conductive regions and isolating regions therein and conductive layers and insulating layers over the substrate. In FIG. 1A, the substrate 10 preferably represents a conductive (e.g., metal) line preferably composed of copper (Cu), tungsten (W), $Al_xCu_y$, tantalum nitride (TaN), titanium nitride, tantalum (Ta), Palladium (Pd), Silver (Ag), or Gold (Au).

The insulating layer 11 has a top surface 11A and sidewalls 11B defining the opening 14. The insulating layer is preferably composed of silicon oxide; polyimide, or low K-dielectrics (such as Flare). The insulating layer preferably has a thickness in a range of between about 500 and 10,000 Å.

Next, a diffusion barrier layer 12 is formed over the insulating layer 11. The diffusion barrier layer 12 is preferably formed by Physical Vapor Deposition (PVD) titanium nitride, CVD titanium nitride (TiN), Physical Vapor Deposition (PVD) tantalum nitride (TaN), chemical vapor deposition (CVD), tantalum nitride (TaN), CVD tungsten nitride (WN) and CVD tantalum and is most preferably composed of tantalum nitride (TaN). The diffusion barrier layer 12 preferably has a thickness in a range of between about 50 and 5000 Å.

The opening 14 preferably has a width in a range of between about 0.1 and 1.0 μm.

Still referring to FIG. 1A, in a important step, a seeding film 13 composed of Pd and palladium acetate is formed on the diffusion barrier layer 12. The seeding film 13 is formed by dip coating or spin-on. The invention's dip coating or spin on process is less expensive and less dangerous than conventional vapor coating processes. The composition of the palladium acetate bath and suit solvent is preferably Pd acetate solvents, chloroform, or methylene chloride with a concentration between about 0.2 M and 1M. To improve the solubility of Pd Acetate, acetic acid can be added.

Before the dip coating or spin process, we preferably clean the diffusion barrier layer using $NH_4F/HF$ and then rinse in DI water.

The seeding film is composed of Pd or a combination of Pd acetate and Pd. The seeding film 13 preferably had a thickness in a range of between about 100 and 1000 Å. The seeding is performed for a time in a range of between about 0.25 and 2 Min and at a temperature in a range of between about 25 and 30° C.

Next, in an optional process, the seeding film 13 composed of a combination of Pd and palladium acetate is thermally decomposed to form a seeding film 13 composed of Palladium. The seeding film 13 is preferably heated using a Rapid thermal tool or furnace or a laser. The wafers are preferably heated to a temperature in a range of between about 250 and 400° C. for a time in a range of between about 1 milli second and 5 minutes.

Figure 1B:
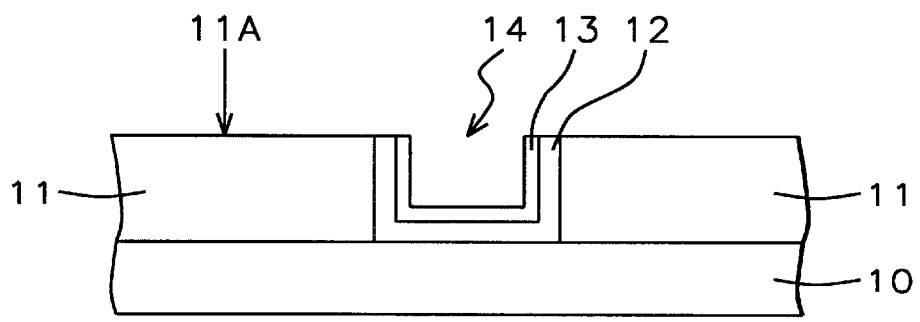

As shown in FIG. 1B, the seeding film 13 (or seeding layer composed of a combination of Pd and Pd acetate if not thermally decomposed) and the diffusing barrier layer 12 over the top surface of the insulating layer 11 are chemical-mechanical polished and removed.

Figure 1C:
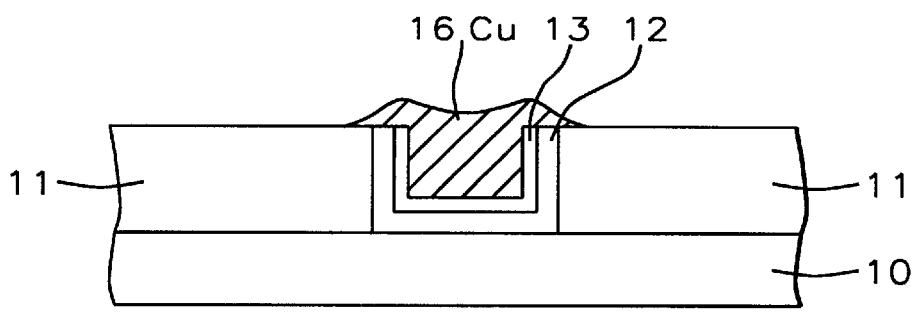

As shown in FIG. 1C, Cu is electroless plated only on the seeding film 13 to form a copper plug (fill) 16 filling the hole 14.

A preferred CU bath for electroless plating is shown below:

| Chemical | Concentration range |
| --- | --- |
| CuSo4 5H$_2$0 | 0.5–0.1 M |
| EDTA | 0.1–0.5 M |
| TMAH/TEAH ** | |
| Ethylene Glycol | 0.5–5% |
| Glyoxylic acid | 0.01–0.1 M |

** (tetramethly ammonium hydroxide) or ammonium hydroxide) to adjust final pH > 12.5.

The inventors have found surprisingly and unexpectedly high quality Cu interconnects formed using the invention's Seeding layer bath and the electroless Cu bath above.

Figure 1D:
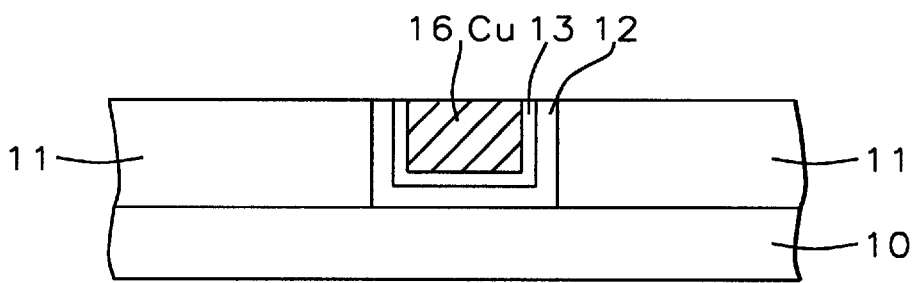

FIG. 1D shows the step of chemical-mechanical polishing the copper fill 16 to planarize the copper fill 16 to a level even with the 11A top surface of the insulating layer 11.

Next, insulating and conductive layers are formed thereover to complete a semiconductor device.

2$^{nd}$ Embodiment—Pd Passivation Cap Layer 17B over Cu Plug 16

FIGS. 2A, 2B, 2C and flow chart FIG. 3 show the second embodiment. The second embodiment forms a Pd passivation layer 17B over the Cu plug 16 to prevent the Cu plug 16 from oxidation. The inventors have found that electroless plated Cu fill's sometimes oxidize which increases resistance and lower device performance.

The processing starts as described above and shown in FIGS. 1A and 1B.

Referring to FIG. 2A, When the Cu fill 16 is electroless plated into the hole 14, the Cu only partially fills the hole 14. See FIG. 3, step 201.

In a key step shown in FIG. 2B, a Pd acetate layer 17A is formed over the Cu fill 16 and over the insulating layer 11. The Palladium (Pd) acetate layer is formed using the invention seeding bath and dip or spin on process described in the first embodiment.

Next, the Pd acetate layer 17A is thermally treated as described above to form a Pd layer 17B. See step 203.

As shown in FIG. 2C, the Pd layer 17B is chemical-mechanical polished (CMPed) to remove the Pd layer over the insulating layer 11 and leave a Pd cap passivation layer 17B over the Cu plug 16. The Pd cap passivation layer 17B prevents the Cu plug 16 from oxidation. In contrast to U.S. Pat. No. 5,674,787 (Zhao et al.) the invention's Pd cap layer 17B is an oxidation barrier and not necessarily a Cu diffusion barrier.

Next, insulating and conductive layers are formed thereover to complete a semiconductor device.

Advantages Of The Invention's $1^{st}$ And $2^{nd}$ Embodiments

The invention's first embodiment application of thermal/non-thermal treated Pd acetate film 13 as a catalytic/seeding layer for electroless copper plating has several advantages:

the kinetics/rate of plating is either comparable or faster than that of the conventional approach.

In the seeding bath, undesirable counter ions like Cl⁻ may be excluded with the present invention where by no such species is present.

The seeding bath comprises mainly two components: ① Pd acetate and ② a suitable solvent. In contrast, conventional seeding baths contain and require three or four toxic and corrosive.

The present invention has lower cost of ownership.

The Second embodiment of the present invention forms a Pd cap passivation layer 17B over the Cu fill 16. The Pd cap passivation layer 17B prevents the Cu fill 16 from oxidizing.

While the invention has been particularly shown and described with reference to the preferred embodiments thereof, it will be understood by those skilled in the art that various changes in form and details may be made without departing from the spirit and scope of the invention.

What is claimed is:

1. A method to deposit a seeding layer for electroless copper plating for a semiconductor device to form an interconnect; comprising the steps of:
   a) forming an insulating layer having an opening over a substrate; said insulating layer having a top surface;
   b) forming a diffusion barrier layer over said insulating layer;
   c) forming a seeding film comprised of Palladium (Pd) over said diffusion barrier layer; said seeding film formed by (1) a process selected from the group consisting of dip coating and spin-on; said seeding layer is formed using a seed bath comprised of Palladium acetate, and a solvent of a material selected from the group consisting of chloroform and methylene chloride; and (2) heating said seeding film to thermally decompose said seeding layer to palladium; and
   d) chemical-mechanical polishing and removing said seeding film and said diffusing barrier layer from over said top surface of said insulating layer; and
   e) electroless plating Cu over said seeding film forming a copper plug at least filling said hole.

2. The method of claim 1 wherein Step (e) further includes electroless plating Cu over said seeding film to form a copper plug only partially filling said hole; and
   forming a passivation layer composed of Pd acetate on said copper plug at least filling said hole; said passivation layer formed by a process selected from the group consisting of dip coating and spin-on; and heating said passivation layer to thermally decomposed said passivation layer to palladium; and
   polishing said passivation layer.

3. The method of claim 1 wherein Step (e) further includes electroless plating Cu over said seeding film forming a copper plug totally filling said hole; and
   chemical-mechanical polishing said copper plug to planarize said copper plug to a level even with said top surface of said insulating layer.

4. The method of claim 1 wherein said diffusion barrier layer is composed of a material selected from the group consisting of TiN, TaN, WN and Ta.

5. The method of claim 1 wherein said diffusing barrier layer has a thickness in a range of between about 50 and 5000 Å.

6. The method of claim 1 wherein said insulating layer is composed of a material selected from the group consisting of silicon oxide, and polyimide, and said insulating layer has a thickness in a range of between about 500 and 10,000 Å.

7. The method of claim 1 wherein said seeding layer is formed using a seed bath comprised of Palladium acetate, acetic acid chloroform, and a solvent of a material selected from the group consisting of chloroform and methylene chloride with a concentration between about 0.2 M and 1.0 M.

8. A method to deposit a seeding layer for electroless copper plating for a semiconductor device to form a copper plug for an interconnect; comprising the steps of:
   a) forming an insulating layer having an opening over a substrate; said insulating layer having a top surface;
   b) forming a diffusion barrier layer over said insulating layer;
   c) forming a seeding film composed of Palladium (Pd) and palladium acetate over said diffusion barrier layer; said seeding film formed by a process selected from the group consisting of dip coating and spin-on; said seeding layer is formed using a seed bath comprised of Palladium acetate, acetic acid chloroform, and a solvent of a material selected from the group consisting of chloroform and methylene chloride with a concentration between about 0.2 M and 1.0 M;
   d) thermally decomposing said seeding film transform at least a portion of said Pd acetate to Pd;
   e) chemical-mechanical polishing and removing said seeding film and said diffusing barrier layer over said top surface of said insulating layer; and
   f) electrolessly plating Cu over said seeding film to form a copper plug filling said hole;
   g) chemical-mechanical polishing said copper plug to planarize said copper plug to a level even with said top surface of said insulating layer.

9. The method of claim 8 wherein said diffusing barrier layer is composed of a material selected from the group consisting of TiN, TaN, WN and Ta.

10. The method of claim 8 wherein said diffusing barrier layer has a thickness in a range of between about 50 and 5000 Å.

11. A method to deposit a seeding layer for electroless copper plating to form a copper plug for an interconnect; comprising the steps of:

a) forming an insulating layer having an opening over a substrate; said insulating layer having a top surface;

b) forming a diffusion barrier layer over said insulating layer;

c) forming a seeding film composed of palladium acetate over said diffusion barrier layer; said seeding film formed by of a process selected from the group consisting of dip coating and spin-on; said seeding layer is formed using a seed bath comprised of Palladium acetate, acetic acid chloroform, and a solvent of a material selected from the group consisting of chloroform and methylene chloride with a concentration between about 0.2 M and 1.0 M;

d) thermally decomposing said seeding film transform at least a portion of said Palladium acetate to Pd;

e) chemical-mechanical polishing and removing said seeding film and said diffusing barrier layer over said top surface of said insulating layer; and f) electrolessly plating Cu over said seeding film forming a copper plug only partially filling said hole; and g) forming a passivation layer composed of palladium (Pd) and palladium acetate at least filling said hole; said passivation layer formed by a process selected from the group consisting of dip coating and spin-on; and polishing said passivation layer thereby forming a Cu plug with a passivation layer for an interconnect.

12. The method of claim 11 wherein said diffusing barrier layer is composed of a material selected from the group consisting of TiN, TaN, WN and Ta.

13. The method of claim 11 wherein said diffusing barrier layer has a thickness in a range of between about 50 and 5000 Å.

14. The method of claim 8, step (f) wherein said electroless plating Cu is performed using a Cu bath with the following conditions: a $CuSO_4$ $5H_2O$ concentration between 0.5 and 0.1 M; a EDTA concentration between 0.1 and 0.5 M; and an ethylene glycol concentration between 0.5 and 5%; a glyoxylic acid concentration between 0.01 and 0.1 M; and a TMAH/TEAH concentration to adjust the final to pH greater than 12.5.

15. The method of claim 11, step (f) wherein said electroless plating Cu is performed using a Cu bath with the following conditions: a $CuSO_4$ $5H_2O$ concentration between 0.5 and 0.1 M; a EDTA concentration between 0.1 and 0.5 M; and an ethylene glycol concentration between 0.5 and 5%; a glyoxylic acid concentration between 0.01 and 0.1 M; and a TMAH/TEAH concentration to adjust the final to pH greater than 12.5.

16. The method of claim 11 wherein step (g) further includes after forming the passivation layer:

heating said passivation layer to thermally decomposed said passivation layer to palladium.

* * * * *

UNITED STATES PATENT AND TRADEMARK OFFICE
CERTIFICATE OF CORRECTION

PATENT NO.    : 6,495,200 B1
DATED         : December 17, 2002
INVENTOR(S)   : Lap Chan, Fong Yau Li and Hou Tee Ng It is certified that error appears in the above-identified patent and that said Letters Patent is hereby corrected as shown below:

<u>Title page,</u>
Item [73], add -- National University of Singapore, Singapore (SG) --

Signed and Sealed this

Third Day of June, 2003

JAMES E. ROGAN
*Director of the United States Patent and Trademark Office*